(12) United States Patent
Edwards et al.

(10) Patent No.: US 6,702,591 B2
(45) Date of Patent: Mar. 9, 2004

(54) CURRENT MODE DATA BUS INCORPORATING INTEGRATED COUPLER CIRCUITRY

(75) Inventors: Wayne A. Edwards, Seattle, WA (US); Theodore C. Ebbinga, Mukilteo, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 09/927,170

(22) Filed: Aug. 10, 2001

(65) Prior Publication Data

US 2003/0032309 A1 Feb. 13, 2003

(51) Int. Cl.$^7$ ............... H01R 12/00; H01R 13/73; H05K 1/00; H01P 3/00
(52) U.S. Cl. ............... 439/76.1; 439/950; 333/242
(58) Field of Search ............... 439/76.1, 76.2, 439/950; 336/DIG. 2; 333/242; 307/104

(56) References Cited

U.S. PATENT DOCUMENTS 4,904,879 A * 2/1990 Rudy et al. ............... 307/104
5,783,873 A    7/1998 Dohan et al. ............... 307/104

* cited by examiner

Primary Examiner—Chandrika Prasad
(74) Attorney, Agent, or Firm—Harness, Dickey & Pierce P.L.C.

(57) ABSTRACT

An interface assembly, which may be used with a current mode data bus, couples to an existing current mode data bus and includes a length of unshielded data bus disposed on a printed circuit board. A plurality of coupler magnetic assemblies are disposed on the circuit board and interface with the unshielded portion of the data bus. A corresponding plurality of coupler circuits are disposed on the circuit board and each cooperate with an associated one of the coupler magnetic assemblies. Providing all of the coupler magnetic assemblies and coupler circuits on the printed circuit board reduces the susceptibility of the unshielded data bus portion to EMI and enables more consistent data channel characteristics to be achieved. An alternative embodiment includes an entire current mode data bus formed on a printed circuit board with terminators at each end of an unshielded portion of the data bus.

7 Claims, 2 Drawing Sheets

CURRENT MODE DATA BUS INCORPORATING INTEGRATED COUPLER CIRCUITRY

FIELD OF THE INVENTION

This invention relates to data buses, and more particularly to a current mode data bus having a plurality of magnetic coupler assemblies and a corresponding plurality of coupling circuits all supported on a single printed circuit board and thus forming an integrated assembly.

BACKGROUND OF THE INVENTION

Present day implementations of current mode data buses typically utilize discrete magnetic coupling devices which are clamped unto unshielded portions of the data bus for each component connected to the data bus. This construction is shown in FIG. 1. The coupler assemblies "C" are magnetically coupled to an unshielded portion "P" of an external bus "B". While generally satisfactory performance is obtained with this form of current mode data bus, there are some shortcomings. For example, the need to leave a portion of the external bus unshielded (i.e., partitioned) invites electromagnetic interference. As a result, such an unshielded length of conductor presents an opportunity for unwanted electromagnetic interference (EMI) emissions and is more susceptible to EMI caused by lightning, which aircraft are often exposed to. Such current mode data buses are also susceptible to varying data channel characteristics.

Accordingly, there exists a need for a current mode data bus interface apparatus which allows a plurality of magnetic coupler assemblies to be magnetically coupled to an unshielded portion of a conductor which is in communication with an existing current mode data bus, and where all of the magnetic coupler assemblies and the unshielded length of conductor are disposed on a single support structure. Such an interface assembly could itself include shielding to thus shield the unshielded portion of the conductor from electromagnetic interference. Providing all the coupler assemblies on a single interface assembly would also allow overall reduced fabrication costs of the coupler assemblies and provide for more consistent data channel characteristics.

SUMMARY OF THE INVENTION

The present invention is directed to a current mode data bus interface assembly. In one preferred embodiment the interface assembly is intended to interface with an existing current mode data bus. In an alternative preferred embodiment, the invention provides a complete current mode data bus on a circuit board assembly.

In the first preferred embodiment, a printed circuit board is provided on which is disposed a plurality of magnetic coupler assemblies. Each of the magnetic coupler assemblies are interfaced to a length of unshielded data bus. One end of the unshielded data bus is coupled to the external current mode data bus. Also disposed on the printed circuit board are a corresponding plurality of coupler circuits located adjacent to associated ones of the magnetic coupler assemblies. The magnetic couplers and coupler circuits, together with the printed circuit board, thus form an interface assembly for allowing a plurality of external devices, such as terminals, to communicate on the existing current mode data bus. This arrangement thus integrates the otherwise discrete coupler assemblies with a single support structure, as well as with each of the coupler circuits associated with the magnetic coupler assemblies. When appropriate shielding is added to the interface assembly, the unshielded length of data bus on the printed circuit board is much less susceptible to EMI. Data channel characteristics are also proved because of the uniformity of construction of the magnetic coupler assemblies and the coupler circuits.

In an alternative preferred embodiment, the entire current mode data bus is provided on the printed circuit board and terminated at each end with suitable terminators. An unshielded portion of the current mode data bus extends between the terminators. Magnetic coupler assemblies magnetically couple the unshielded portion of the data bus to associated coupler circuits. This embodiment also provides the advantages of reducing EMI on the unshielded portion of the data bus as well as establishing more consistent data channel characteristics.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
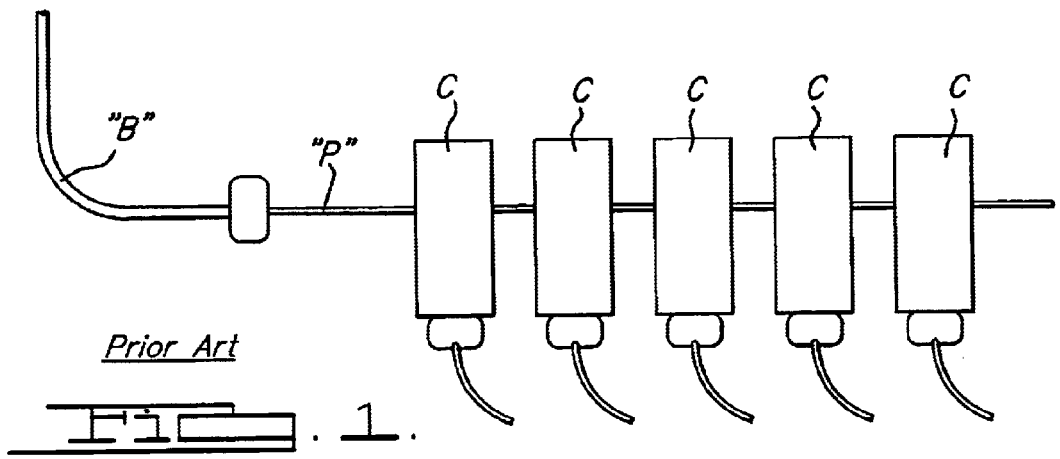
FIG. 1 is a simplified schematic view of a prior art current mode data bus showing the discrete coupler assemblies each coupled through an unshielded portion of the data bus.
Figure 2:
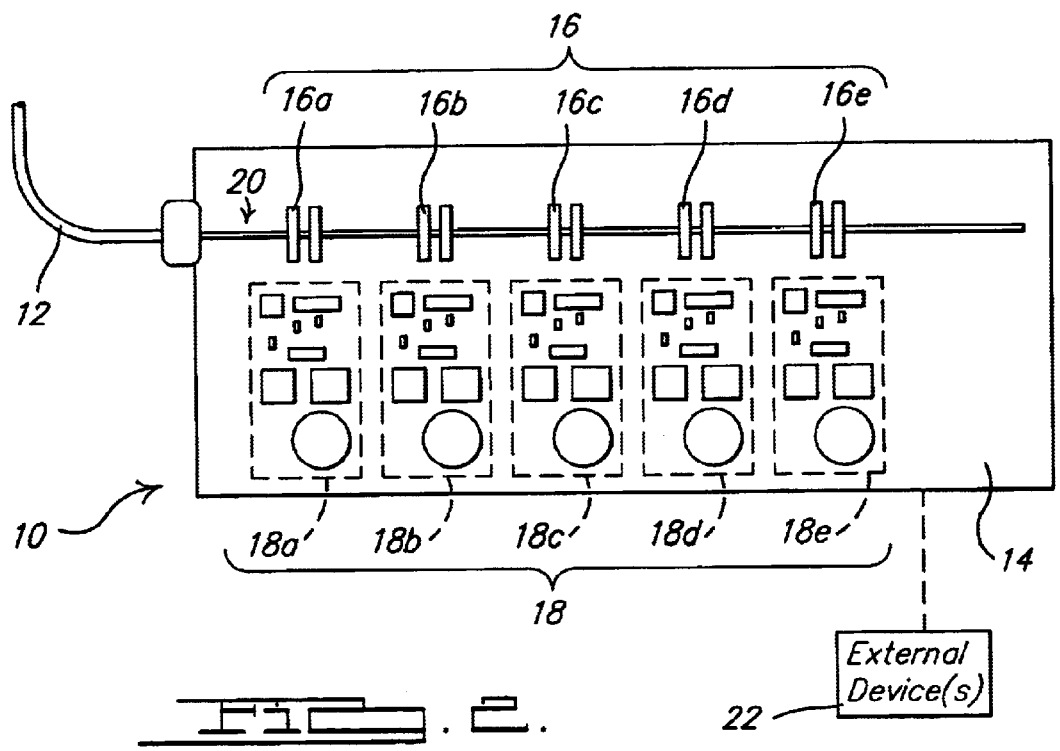
FIG. 2 is a simplified schematic drawing of an interface assembly in accordance with a preferred embodiment of the present invention for coupling to an existing current mode data bus.

Referring to FIG. 2, there is shown an interface assembly 10 for interfacing with an existing current mode data bus 12. The interface assembly 10 includes a printed circuit board or like substrate 14 having formed thereon a plurality of independent magnetic coupler assemblies 16a–16e in spaced apart relation to one another. A plurality of coupler circuits 18, illustrated in highly simplified form, are disposed on or integrally with the circuit board 14 closely adjacent an associated one of the magnetic coupler assemblies 16. It will be appreciated immediately that a greater or lesser plurality of coupler assemblies 16 and coupler circuits 18 could be employed depending on the number of external devices 22 which need to be interfaced to the assembly 10.

Each of the magnetic coupler assemblies 16 is electrically coupled to its associated coupling circuit 18a–18e. Thus, magnetic coupler 16a is associated with coupling circuit 18a, magnetic coupler 16b is associated with coupler circuit 18b and so forth. The magnetic couplers 16a–16e are preferably identical in construction to one another. Similarly, coupler circuits 18a–18e are preferably identical in construction.

The construction of the individual coupler assemblies 16 is otherwise conventional and well known in the art. Similarly, coupler circuits, 18a–18e are conventional coupler circuits for interfacing the coupler assembly 10 with external devices 22 such as terminals or equivalent signaling devices. The unshielded portion of data bus 20 consists of two or more conductors and suitable dielectric materials arranged to achieve the desired characteristic impedance. The unshielded portion of the data bus 20 may be formed integrally on or within the printed circuit board 14 or may be formed as an external component which is secured to either surface of the printed circuit board. Optionally, shielding can be incorporated within or on the circuit board 14 to shield the otherwise unshielded portions of the data bus 20. Still further, the magnetic coupler assemblies 16a–16e may include material features such as choice and arrangement of conductors, insulators, etc., so as to minimize perturbation of the data bus impedance due to the existence of elements of each of the assemblies 16a–16e.

A principal advantage of the interface assembly 10 is that all of the magnetic coupler assemblies 16a–16e are secured on a single substrate. With suitable shielding (not shown) around the printed circuit board 14, the unshielded portion of the data bus 20 is far less susceptible to EMI than would otherwise be the case with discrete coupler assemblies secured to the unshielded portion of the data bus at various points therealong. Suitable shielding or a portion thereof may be integral to (or formed within) the printed circuit board to improve performance and reduce costs. The cost of using any given number of couplers is also reduced by providing an integrated assembly having the desired number of couplers thereon along with a required number of coupler circuits. Troubleshooting of any potential problems with the magnetic coupler assemblies 16a–16e is also simplified because an entire interface assembly 10 can be quickly removed from the existing current mode data bus 12 and replaced with a new assembly 10. Fabrication of an entire, integrally formed printed circuit assembly allows a greater degree of consistency between identical assemblies.

Figure 3:
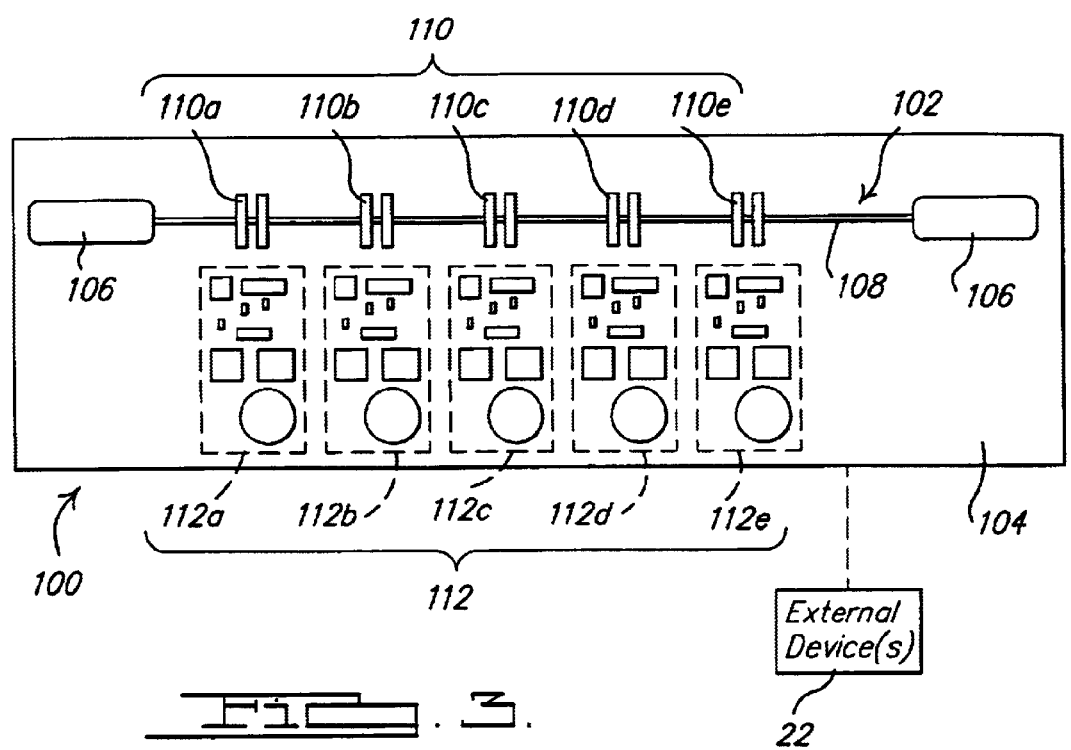
FIG. 3 is an alternative preferred embodiment of the present invention showing the current mode data bus formed entirely on a printed circuit board of the present invention.

Referring now to FIG. 3, a current mode data bus 100 in accordance with an alternative preferred embodiment of the present invention is shown. Apparatus 100 is different than the interface assembly 10 in that apparatus 100 includes the entire current mode data bus 102 on a printed circuit board 104. The data bus 102 includes a pair of terminators 106 at each end thereof and an unshielded portion 108 extending between the terminators 106. Of course, terminators 106 could be omitted depending on the specific implementation of the invention.

Coupler magnetic assemblies 110a–110e are disposed over the unshielded portion 108 of the data bus 102. Each of the coupler magnetic assemblies 110a–110e is independently associated with one of a plurality of coupler circuits 112a–112e, respectively. The coupler magnetic assemblies 110 and the coupler circuits 112 are otherwise identical to assemblies 16 and circuits 18, respectively, of FIG. 2.

The preferred embodiments of the present invention thus provide a more cost effective means for coupling a plurality of external devices to a current mode data bus. The preferred embodiments reduce the time to troubleshoot a malfunctioning coupler magnetic assembly because all the assemblies are disposed on a single printed circuit board. Suitable shielding used with the printed circuit board further ensures against EMI as a result of the unshielded portion of the data bus that must be present for the coupler magnetic assemblies to interface with.

While the preferred embodiments have been described in connection with a plurality of coupler magnetic assemblies 16 or 110 and a corresponding plurality of coupler circuits 18 or 112, respectively, it will be appreciated that the principals of the present invention could be applied with just a single coupler magnetic assembly and a single coupler circuit each disposed on a printed circuit board. Thus, the preferred embodiments are not limited to any particular number of coupler magnetic assemblies or coupler circuits.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A current mode data bus apparatus for coupling at least one external device to a current mode data bus, said apparatus comprising:

a printed circuit board;

an unshielded current mode data bus formed directly on said printed circuit board;

a plurality of coupling circuits formed on said printed circuit board; and a corresponding plurality of magnetic coupling assemblies disposed on said printed circuit board and in spaced apart relation to one another for coupling external devices to said coupling circuits, and thereby to said unshielded current mode data bus.

2. The apparatus of claim 1, wherein said unshielded current mode data bus includes a terminator at each end thereof supported on said printed circuit board.

3. A current mode data bus interface apparatus for interfacing an one external device to a plurality of electrical subsystems coupled to an existing data bus, said apparatus comprising:

a printed circuit board;

an unshielded data bus formed directly on said printed circuit board and coupled to said existing data bus at one end thereof;

a plurality of independent coupler circuits disposed on said circuit board in spaced apart relation to one another, said coupler circuits being in communication with said external device; and a corresponding plurality of magnetic coupler assemblies disposed on said printed circuit board in spaced apart relation to one another and adjacent to said coupler circuits such that each said coupler circuits to said unshielded data bus and interfacing said unshielded data bus with said coupler circuits.

4. The apparatus of claim 3, further including a terminator at an end of said current mode data bus opposite to that end coupled to said existing data bus.

5. The apparatus of claim 3, wherein said unshielded data bus comprises an external conductor secured to said printed circuit board.

6. A method for interfacing an existing current mode data bus to an external device, said method comprising the steps of:

providing an unshielded data bus having a plurality of conductors formed directly on a printed circuit board;

disposing a plurality of coupler circuits on said circuit board in spaced apart relation to one another, said coupler circuits being adapted to be coupled to at least one external device; and disposing a plurality of magnetic coupling assemblies on said printed circuit board in spaced apart relation to one another and magnetically coupled to said unshielded data bus for magnetically coupling said unshielded data bus to said coupler circuits.

7. A current mode data bus interface apparatus for coupling at least one external device to an existing current mode data bus, said apparatus comprising:

a printed circuit board;

an unshielded data bus formed directly on said printed circuit board and coupled to said existing data bus at one end thereof;

a coupler circuit disposed on said circuit board, said coupler circuit being in communication with said external device;

a magnetic coupler assembly disposed on said printed circuit board for magnetically coupling said coupler circuit to said unshielded data bus;

a plurality of said coupler circuits disposed on said printed circuit board in spaced apart relation to one another; and a corresponding plurality of said magnetic coupler assemblies disposed on said printed circuit board in spaced apart relation in accordance with said plurality of coupler circuits.

* * * * *